United States Patent
Chun

(10) Patent No.: US 7,142,467 B2
(45) Date of Patent: Nov. 28, 2006

(54) SYNCHRONOUS SEMICONDUCTOR MEMORY DEVICE

(75) Inventor: Jun Hyun Chun, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 41 days.

(21) Appl. No.: 11/004,842

(22) Filed: Dec. 7, 2004

(65) Prior Publication Data

US 2006/0104149 A1    May 18, 2006

(30) Foreign Application Priority Data

Nov. 15, 2004   (KR) .................... 10-2004-0093220

(51) Int. Cl.
*G11C 7/00*   (2006.01)
(52) U.S. Cl. .................. 365/193; 365/230.08; 365/233
(58) Field of Classification Search ................ 365/193, 365/230.08, 233
See application file for complete search history.

(56) References Cited

U.S. PATENT DOCUMENTS

| 6,256,260 B1 | 7/2001 | Shim et al. |
| 6,636,443 B1 * | 10/2003 | Kang |
| 6,636,446 B1 * | 10/2003 | Lee et al. |
| 6,697,296 B1 | 2/2004 | Matsumoto et al. |
| 6,700,816 B1 * | 3/2004 | Takahashi et al. |
| 6,704,242 B1 * | 3/2004 | Kobayashi |

FOREIGN PATENT DOCUMENTS

KR    1999-0074904    10/1999

\* cited by examiner

*Primary Examiner*—Hoai V. Ho
(74) *Attorney, Agent, or Firm*—Heller Ehrman LLP

(57) ABSTRACT

A synchronous semiconductor memory device reduces operation current by limiting unnecessary internal operations with a command interval defined in the JEDEC Standard. The synchronous semiconductor memory device comprises a clock buffer, a plurality of command buffers, a plurality of address buffers, a command decoder, a clock driving unit, and a plurality of address latches. Here, the command decoder generates an internal command in response to output signals from the plurality of command buffers synchronously with respect to an internal clock. The clock driving unit drives a clock outputted from the clock buffer to generate the internal clock, and generates a latch clock that toggles only when the internal command is generated. The plurality of address latches generates a plurality of latch addresses in response to a plurality of internal addresses outputted from the plurality of address buffers synchronously with respect to the latch clock.

8 Claims, 7 Drawing Sheets

SYNCHRONOUS SEMICONDUCTOR MEMORY DEVICE

BACKGROUND OF THE INVENTION

1. Field of the Invention

The present invention generally relates to a synchronous semiconductor memory device, and more specifically, to a technology of reducing an operation current by limiting unnecessary internal operations with a command interval defined in a standard.

2. Description of the Prior Art

FIG. 1 is a block diagram illustrating a conventional synchronous semiconductor memory device. Here, the conventional synchronous semiconductor memory device that receives a plurality of commands and addresses is operated synchronously with respect to a clock.

The synchronous semiconductor memory device comprises a plurality of pads 1~7, a plurality of buffers 11~17, a clock driving unit 21, a state machine 22 and an address latch 23.

The plurality of pads 1~7 includes a clock pad 1 for receiving clocks CK and /CK, command pads 2~5, and address pads 6 and 7 for receiving a plurality of addresses A0~Ai. Here, the commands pads 2~5 include a chip selection command pad 2 for receiving a chip selection command /CS, a /RAS command pad 3 for receiving a row address strobe command /RAS, a /CAS command pad 4 for receiving a column address strobe command /CAS, and a /WE command pad 5 for receiving a write enable command /WE.

The plurality of buffers 11~17 includes a clock buffer 11 for buffering the clocks CK and /CK applied to the clock pad 1, a plurality of command buffers 13~15 for buffering a plurality of commands such as /CS, /RAS, /CAS and /WE applied to the command pads 2~5, and address buffers 16 and 17 for buffering the plurality of addresses A0~Ai applied to the address pads 6 and 7.

The clock driving unit 21 drives a clock CLK0 outputted from the clock buffer 11 to generate an internal clock iCLK.

The command decoder 22 generates internal commands such as MRS (Mode Register Set), ACT (active), WR (write) and RD (read) in response to commands outputted from the plurality of command buffers 12~15 synchronously with respect to the internal clock iCLK.

The address latch 23 generates latch addresses LA0~LAi in response to addresses outputted from the address buffers 16 and 17 synchronously with respect to the internal clock iCLK.

FIG. 2 is a timing diagram illustrating the operation of the synchronous semiconductor memory device of FIG. 1.

The address latch 23 latches the address synchronously with respect to the internal clock iCLK like the operation of the command decoder 22. As a result, the address latch 23 latches new addresses at every clock regardless of operation commands.

Since the JEDEC standard of tMRD (Mode register set command cycle time) and tCCD (CAS to CAS delay command cycle time) defines 2 clocks, the address of the clock after commands such as MRS, RD and WR is not effectively used in the synchronous semiconductor memory device.

However, since the conventional synchronous semiconductor memory device latches the addresses synchronously with respect to the internal clock iCLK regardless of input commands, unnecessary operation current is consumed.

SUMMARY OF THE INVENTION

Accordingly, it is an object of the present invention to reduce unnecessary operation current for latching addresses by preventing a clock from being generated after a specific command is applied.

In an embodiment, a synchronous semiconductor memory device comprises a clock buffer for buffering an external clock, a plurality of command buffers for buffering a plurality of external commands, a plurality of address buffers for buffering a plurality of external addresses, a command decoder, a clock driving unit and a plurality of address latches. Here, the command decoder generates an internal command in response to output signals from the plurality of command buffers synchronously with respect to the internal clock. The clock driving unit drives a clock outputted from the clock buffer to generate an internal clock, and generates a latch clock that toggles only when the internal command is generated. The plurality of address latches generate a plurality of latch addresses in response to a plurality of internal addresses outputted from the plurality of address buffers synchronously with respect to the latch clock.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
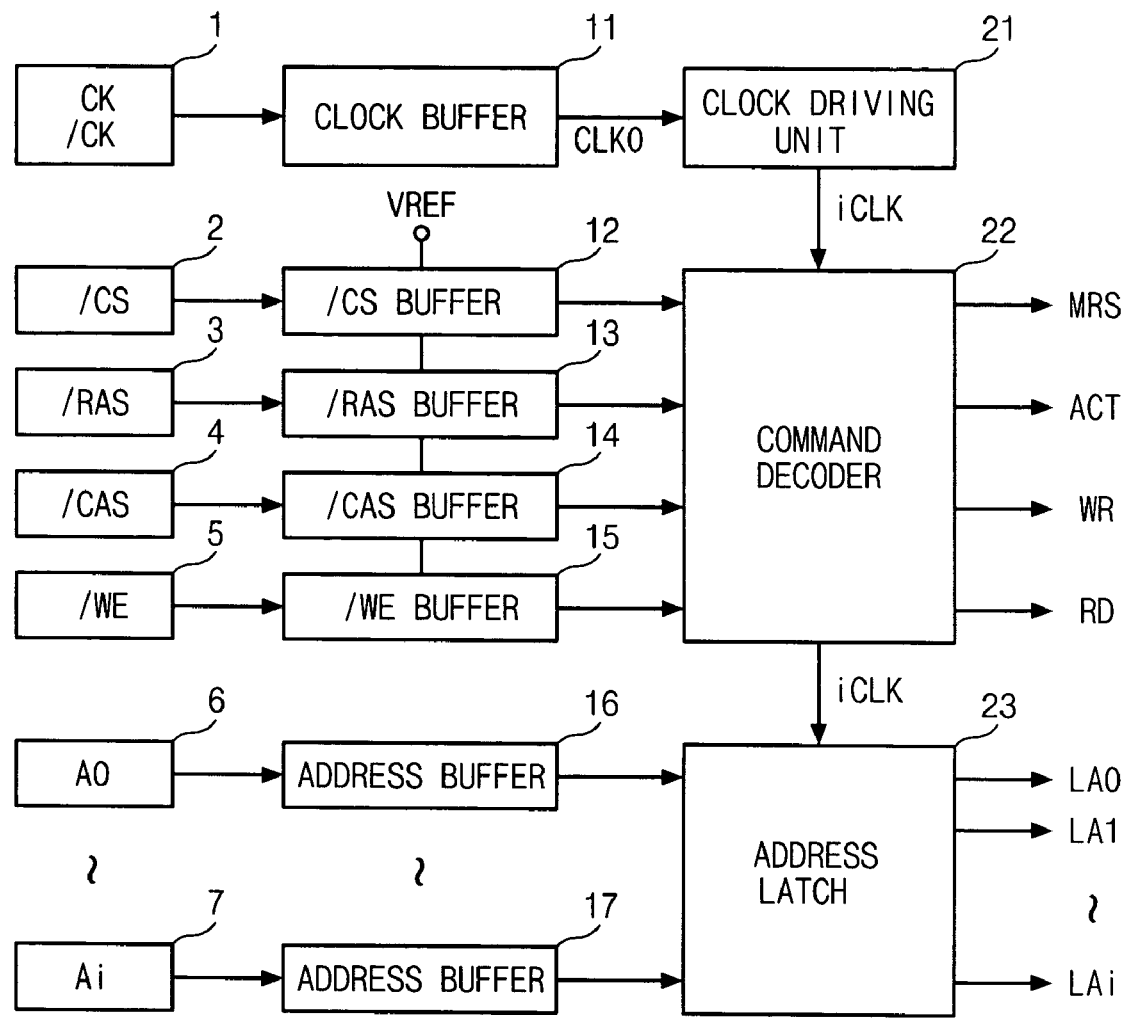
FIG. 1 is a block diagram illustrating a conventional synchronous semiconductor memory device.
Figure 2:
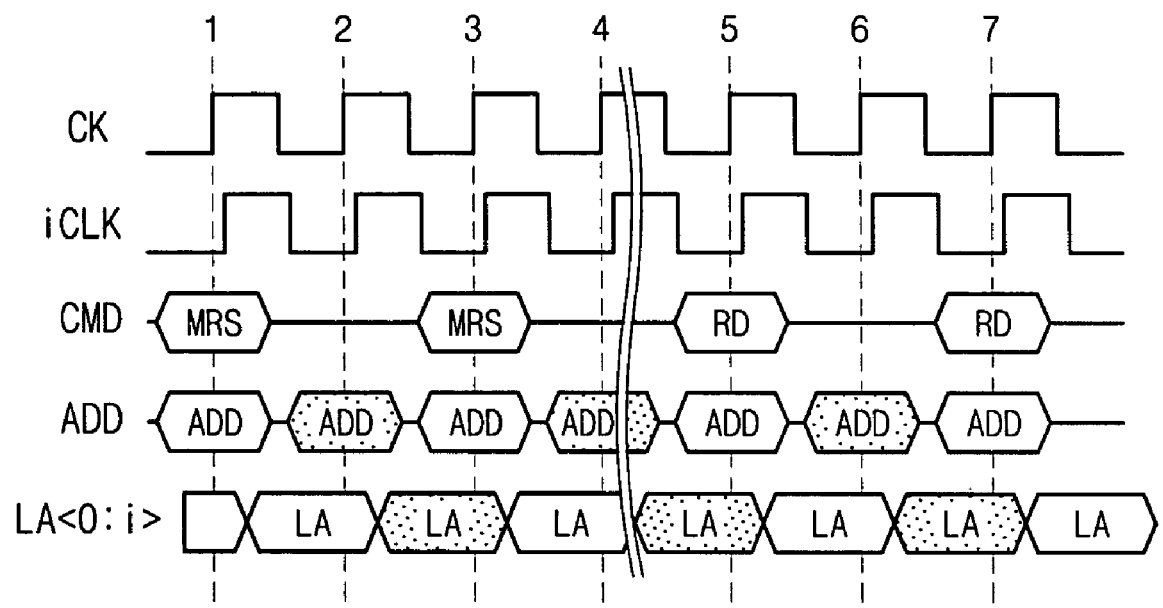
FIG. 2 is a timing diagram illustrating the operation of the synchronous semiconductor memory device of FIG. 1.
Figure 3:
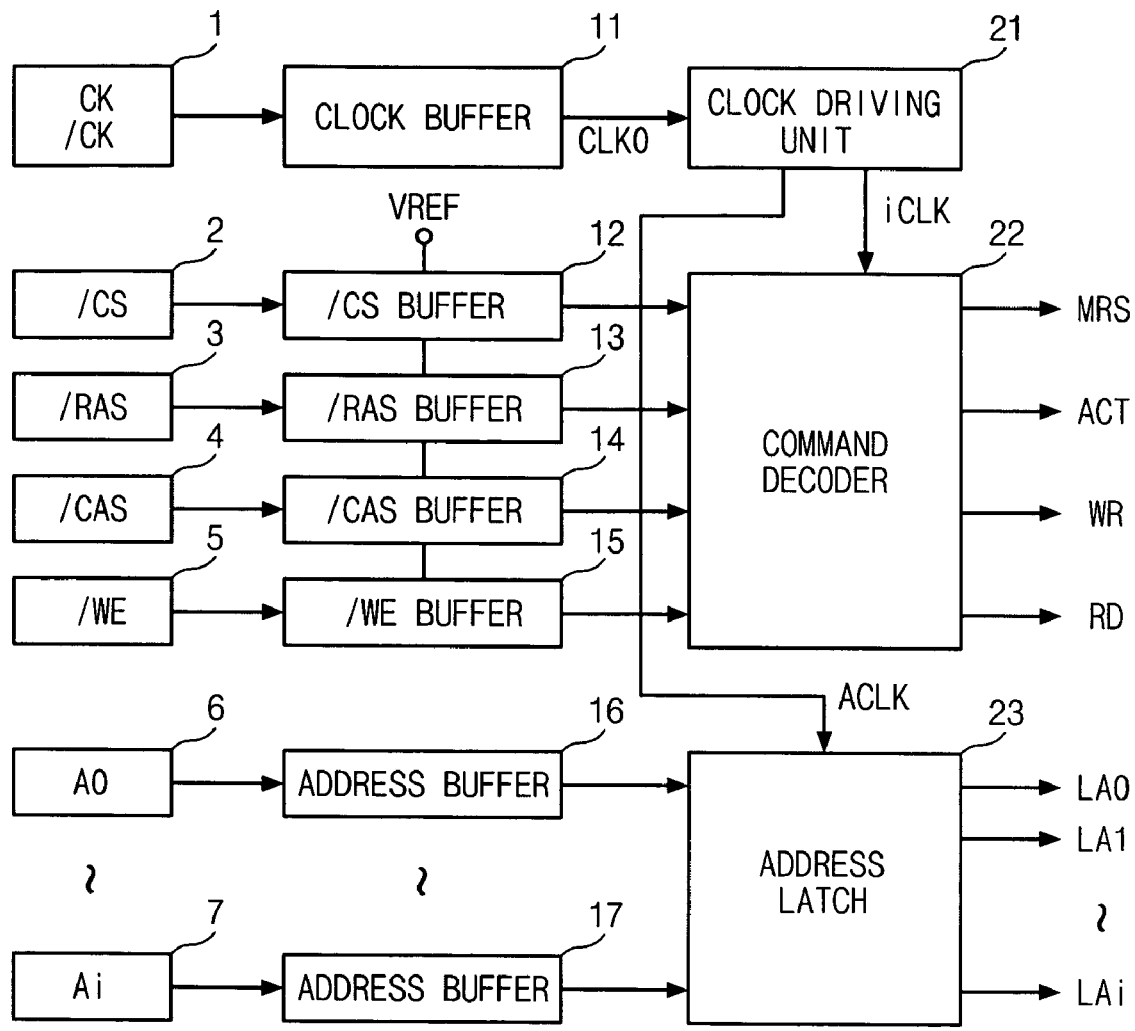
FIG. 3 is a block diagram illustrating a synchronous semiconductor memory device according to an embodiment of the present invention.

FIG. 3 is a block diagram illustrating a synchronous semiconductor memory device according to an embodiment of the present invention. Here, the synchronous semiconductor memory device which receives a plurality of commands and addresses is operated synchronously with respect to a clock.

In an embodiment, the synchronous semiconductor memory device comprises a plurality of pads 1~7, a plurality of buffers 11~17, a clock driving unit 24, a state machine 22 and an address latch 23.

The plurality of pads 1~7 includes a clock pad 1 for receiving clocks CK and /CK, command pads 2~5, and address pads 6 and 7 for receiving a plurality of addresses A0~Ai. Here, the commands pads 2~5 include a chip selection command pad 2 for receiving a chip selection command /CS, a /RAS command pad 3 for receiving a row address strobe command /RAS, a /CAS command pad 4 for receiving a column address strobe command /CAS, and a /WE command pad 5 for receiving a write enable command /WE.

The plurality of buffers 11~17 includes a clock buffer 11 for buffering the clocks CK and /CK applied to the clock pad 1, a plurality of command buffers 13~15 for buffering a plurality of commands such as /CS, /RAS, /CAS and /WE applied to the command pads 2~5, and address buffers 16 and 17 for buffering the plurality of addresses A0~Ai applied to the address pads 6 and 7.

The clock driving unit 24 drives a clock CLK0 outputted from the clock buffer 11 to generate an internal clock iCLK and a latch clock ACLK which synchronizes the operation of the address latch 23.

The command decoder 22 generates internal commands such as MRS (Mode Register Set), ACT (active), WR (write) and RD (read) in response to commands outputted from the plurality of command buffers 12~15 synchronously with respect to the internal clock iCLK.

The address latch 23 generates latch addresses LA0~LAi in response to addresses outputted from the address buffers 16 and 17 synchronously with respect to the internal clock iCLK.

Figure 4:
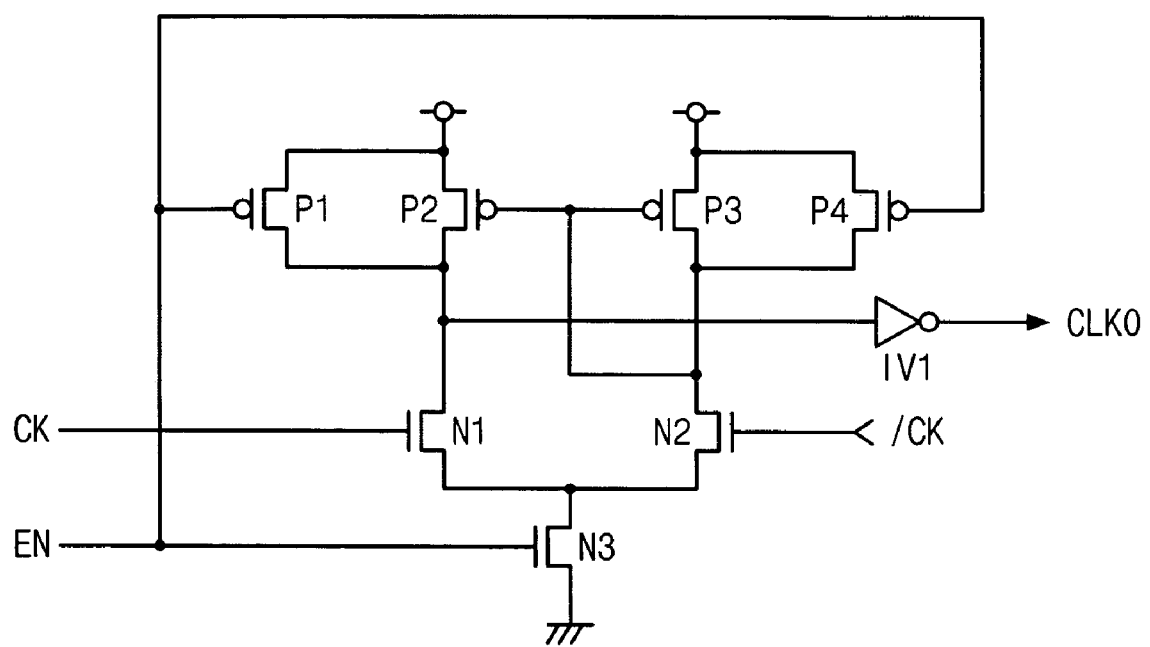
FIG. 4 is a circuit diagram illustrating a clock buffer of FIG. 3.

FIG. 4 is a circuit diagram illustrating the clock buffer 11 of FIG. 3.

The clock buffer 11 comprises PMOS transistors P1~P4, NMOS transistors N1~N3 and an inverter IV1.

The PMOS transistors P2 and P3 form a current mirror, and the PMOS transistors P1 and P4 prevents floating of an output terminal when an enable signal EN is inactivated.

The NMOS transistors N1 and N2 form an input terminal to receive the clocks CK and /CK.

The NMOS transistor N3 activates the clock buffer 11 in response to the enable signal EN.

The inverter IV1 inverts a potential of the output terminal to generate the clock CKL0.

The detailed explanations on the command buffers 12~15 and the address buffers 16~17 are omitted since they are configured to have the same structure as that of the clock buffer of FIG. 4. However, it is different in that a reference voltage VREF instead of the clock /CK is applied to the NMOS transistor N2 which forms the input terminal of the clock buffer 11.

Figure 5:
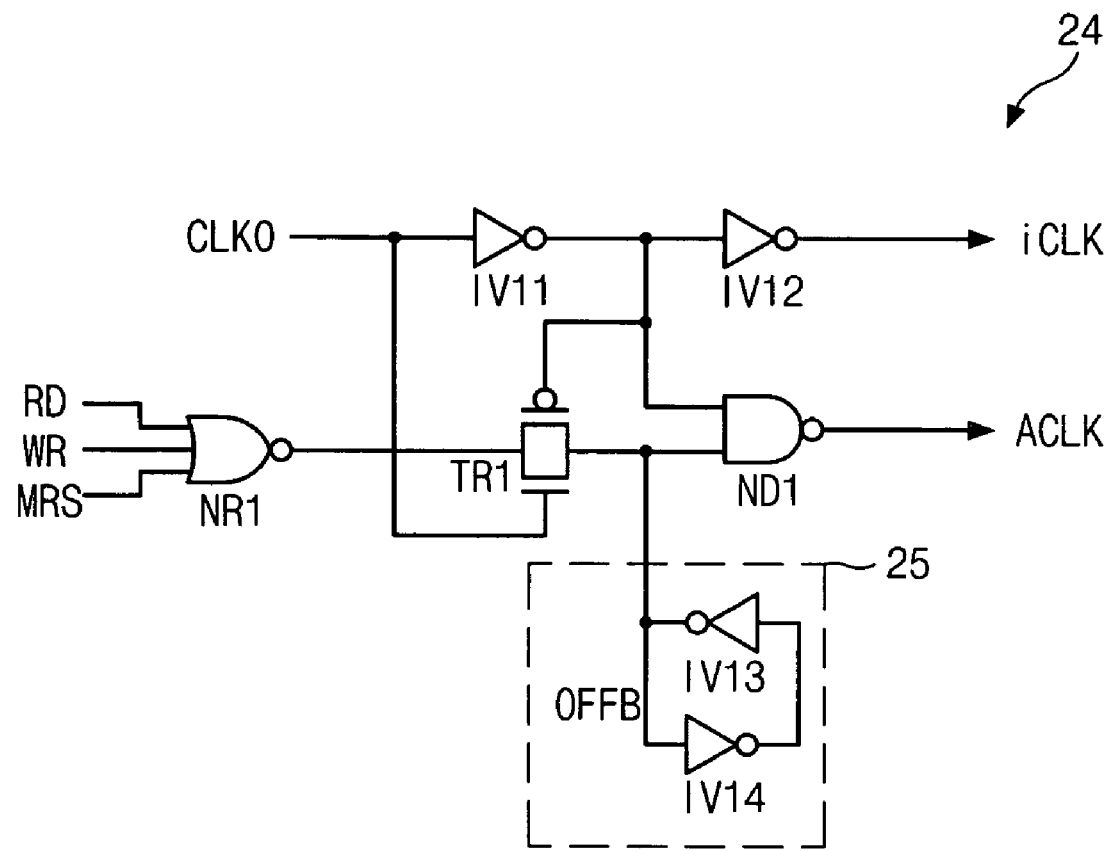
FIG. 5 is a circuit diagram illustrating a clock driving unit of FIG. 3.

FIG. 5 is a circuit diagram illustrating the clock driving unit 24 of FIG. 3.

The clock driving unit 24 comprises a latch unit 25, a NOR gate NR1, a NAND gate ND1, a transmission gate TR1, and inverters IV11 and IV12. Here, the latch unit 25 includes two inverters IV13 and IV14.

The inverters IV11 and IV12 sequentially invert the clock CLK0 outputted from the clock buffer 11.

The NOR gate NR1 performs a NOR operation on the internal commands such as RD, WR and MRS, and the transmission gate TR1 selectively transmits an output signal from the NOR gate NR1 in response to the clock CLK0 and a clock outputted from the inverter IV11.

The NAND gate ND1 performs a NAND operation on the clock outputted from the inverter IV11 and a signal OFFB transmitted from the transmission gate TR1, and outputs the latch clock ACLK.

The latch unit 25 maintains a level of the signal OFFB transmitted from the transmission gate TR1.

Figure 6:
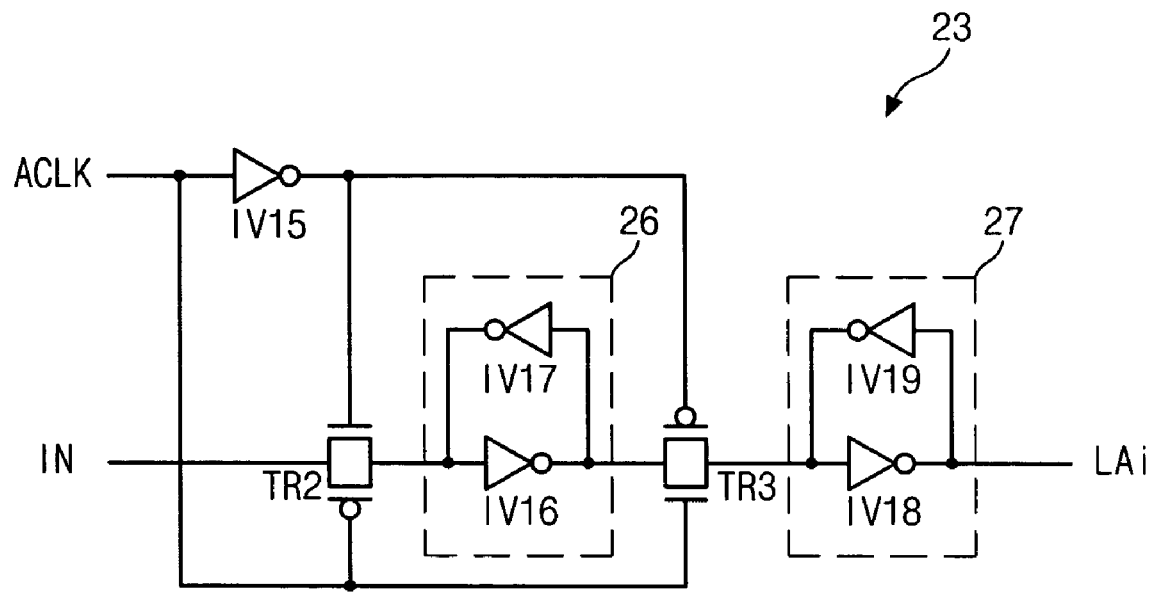
FIG. 6 is a circuit diagram illustrating an address latch of FIG. 3.

FIG. 6 is a circuit diagram illustrating the address latch 23 of FIG. 3.

The address latch 23 comprises latch units 26 and 27, an inverter IV15, and transmission gates TR2 and TR3. Here, the first latch unit 26 includes inverters IV16 and IV17, and the second latch unit 27 includes inverters IV18 and IV19.

The inverter IV15 inverts the latch clock ACLK.

The first transmission gate TR2 selectively transmits an address IN outputted from the address buffers 16 and 17 in response to the latch clock ACLK and a clock outputted from the inverter IV15. Then, the first latch unit 26 latches an address transmitted from the first transmission gate TR2.

The second transmission gate TR3 selectively transmits the address latched in the first latch unit 26 in response to the clock outputted from the inverter IV15 and the latch clock ACLK. Then, the second latch unit 27 latches an address outputted from the second transmission gate TR3 to output a latch address LAi.

Figure 7:
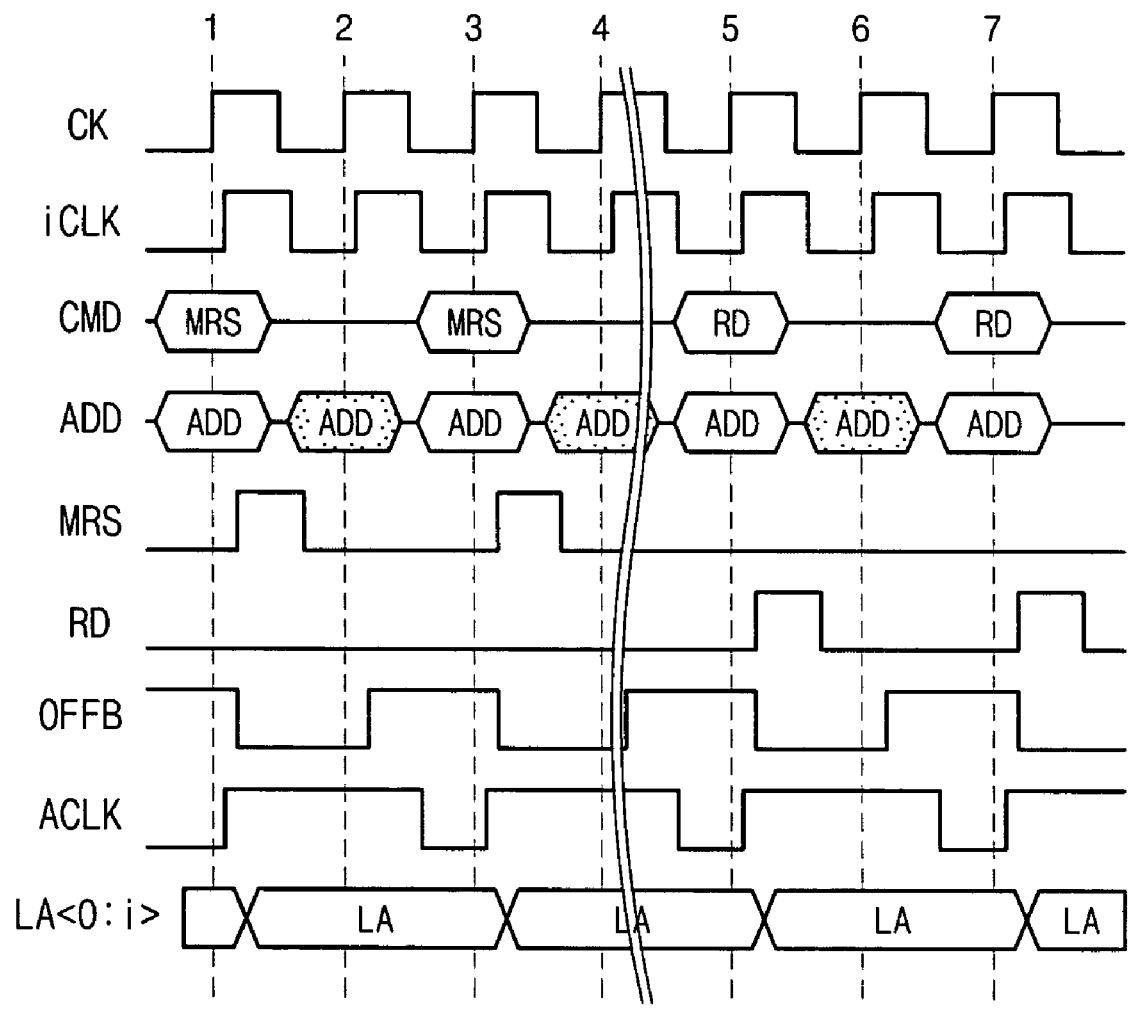
FIG. 7 is a timing diagram illustrating the operation of the synchronous semiconductor memory device of FIG. 3.

FIG. 7 is a timing diagram illustrating the operation of the synchronous semiconductor memory device of FIG. 3.

In an embodiment, the address latch 23 of the synchronous semiconductor memory device latches addresses in response to the latch clock ACLK which toggles when the internal commands RD, WR and MRS are generated. As a result, the operation current can be reduced more than when the latch operation is performed at every clock of the internal clock iCLK.

As discussed earlier, in an embodiment of the present invention, a synchronous semiconductor memory device reduces unnecessary current by generating a clock used in an address latch which toggles when commands are inputted.

Also, the synchronous semiconductor memory device according to an embodiment of the present invention is stably operated by securing an effective timing margin of commands and addresses at high frequency.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A synchronous semiconductor memory device comprising:
   a clock buffer for buffering an external clock;
   a plurality of command buffers for buffering a plurality of external commands;
   a plurality of address buffers for buffering a plurality of external addresses;
   a command decoder for generating a plurality of internal commands in response to output signals from the plurality of command buffers synchronously with respect to an internal clock;
   a clock driving unit for driving a clock outputted from the clock buffer to generate the internal clock and generating a latch clock, wherein a specific level of the latch clock is maintained from a time point when one of the plurality of internal commands is applied to a time point when a next one of the plurality of internal commands is applied; and
   a plurality of address latches for generating a plurality of latch addresses in response to a plurality of internal addresses outputted from the plurality of address buffers synchronously with respect to the latch clock.

2. The synchronous semiconductor memory device according to claim 1, wherein the clock driving unit comprises:

an internal clock generating unit for driving a clock outputted from the clock buffer to generate the internal clock; and a latch clock generating unit for generating the latch clock in response to the clock outputted from the clock buffer and the internal command.

3. The synchronous semiconductor memory device according to claim 2, wherein the internal clock generating unit includes an inverter chain for sequentially inverting the clock outputted from the clock buffer.

4. The synchronous semiconductor memory device according to claim 2, wherein the latch clock generating unit comprises:

a first logic combination means for logically combining the internal commands;

a transmission means for selectively transmitting an output signal from the first logic combination means in response to the clock outputted from the clock buffer; and a second logic combination means for logically combining the clock outputted from the clock buffer and a signal transmitted from the transmission means.

5. The synchronous semiconductor memory device according to claim 4, wherein the latch clock generating unit further comprises a latch means for maintaining a level of the signal transmitted from the transmission means.

6. The synchronous semiconductor memory device according to claim 4, wherein the first logic combination means comprises a NOR gate.

7. The synchronous semiconductor memory device according to claim 4, wherein the second logic combination means comprises a NAND gate.

8. The synchronous semiconductor memory device according to claim 1, wherein each of the plurality of address latches comprises:

a first transmission means for selectively transmitting the corresponding internal address in response to the latch clock;

a first latch means for latching the internal address transmitted through the first transmission means;

a second transmission means for selectively transmitting an address latched in the first latch means in response to the latch clock; and a second latch means for latching an address transmitted through the second transmission means to output the latched address to the address latch.

* * * * *